United States Patent
Fukuda

(10) Patent No.: US 12,422,380 B2
(45) Date of Patent: Sep. 23, 2025

(54) MEASUREMENT METHOD, MEASUREMENT SYSTEM, AND NON-TRANSITORY COMPUTER READABLE MEDIUM

(71) Applicant: Hitachi High-Tech Corporation, Tokyo (JP)

(72) Inventor: Hiroshi Fukuda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 645 days.

(21) Appl. No.: 17/859,577

(22) Filed: Jul. 7, 2022

(65) Prior Publication Data

US 2023/0019371 A1   Jan. 19, 2023

(30) Foreign Application Priority Data

Jul. 19, 2021 (JP) ................. 2021-118433

(51) Int. Cl.
*G01N 21/956* (2006.01)
*G06T 7/00* (2017.01)
*H01L 21/66* (2006.01)

(52) U.S. Cl.
CPC ....... *G01N 21/95607* (2013.01); *G06T 7/001* (2013.01); *H01L 22/12* (2013.01); *G06T 2207/30148* (2013.01)

(58) Field of Classification Search
None
See application file for complete search history.

(56) References Cited

U.S. PATENT DOCUMENTS

| 10,643,326 B2 | 5/2020 | Toyoda et al. |
| 2007/0221842 A1 | 9/2007 | Morokuma et al. |
| 2011/0158543 A1 | 6/2011 | Morokuma et al. |
| 2014/0320627 A1 | 10/2014 | Miyamoto et al. |

(Continued)

FOREIGN PATENT DOCUMENTS

| CN | 101038670 A | 9/2007 |
| JP | 2006-170924 A | 6/2006 |

(Continued)

*Primary Examiner* — Jack S Chen
(74) *Attorney, Agent, or Firm* — Crowell & Moring LLP

(57) ABSTRACT

An object is to provide a measurement system or the like that enables selection of appropriate new measurement targets by performing measurement on a limited number of measurement points.

Proposed is a system including a measurement tool; and a computer system configured to communicate with the measurement tool, in which the computer system is configured to calculate, based on feature data of a plurality of locations on a wafer received from the measurement tool, an in-plane distribution of the feature data on the wafer (C), select, based on the calculated in-plane distribution, a new measurement point for acquiring the feature data (D), calculate, based on feature data acquired by measuring the selected new measurement point (B), a new in-plane distribution of the feature data on the wafer (F), and output at least one of the feature data of the new measurement point and the in-plane distribution which are acquired by executing the selection of the new measurement point and the calculation of the new in-plane distribution at least once (H).

18 Claims, 9 Drawing Sheets

(56) References Cited

U.S. PATENT DOCUMENTS

2019/0186910 A1   6/2019  Fukuda
2022/0130027 A1   4/2022  Fukuda et al.
2023/0019371 A1*  1/2023  Fukuda ................. G06T 7/0004

FOREIGN PATENT DOCUMENTS

| JP | 5809997 B2      | 11/2015 |
| KR | 10-2014-0101420 A | 8/2014  |
| KR | 10-2020-0128193 A | 11/2020 |
| KR | 10-2021-0053326 A | 5/2021  |
| TW | 201334029 A1    | 8/2013  |
| TW | 202101626 A1    | 1/2021  |

* cited by examiner

[FIG. 1]
[FIG. 2]
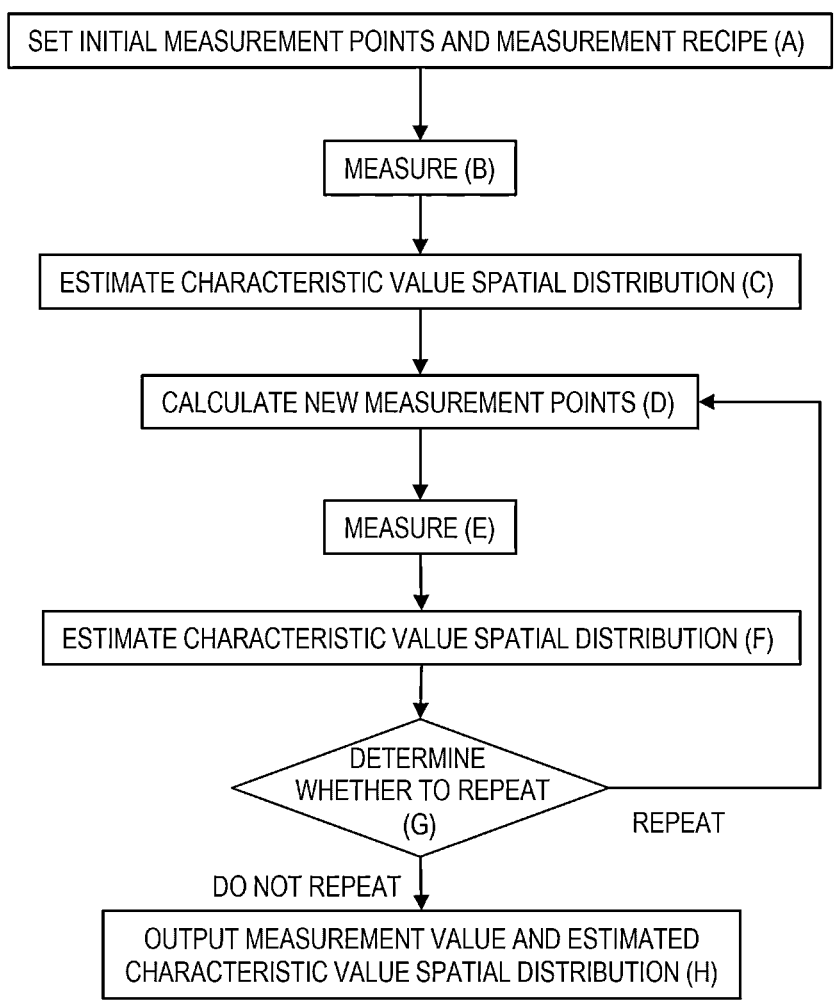

[FIG. 3]
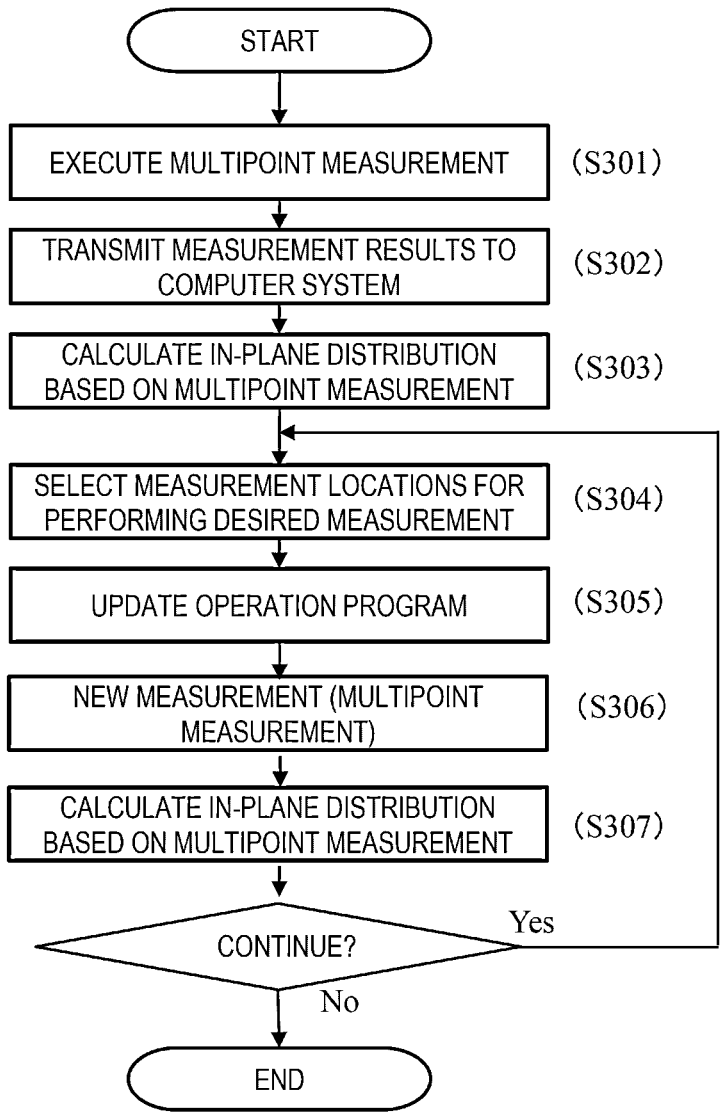

[FIG. 4]
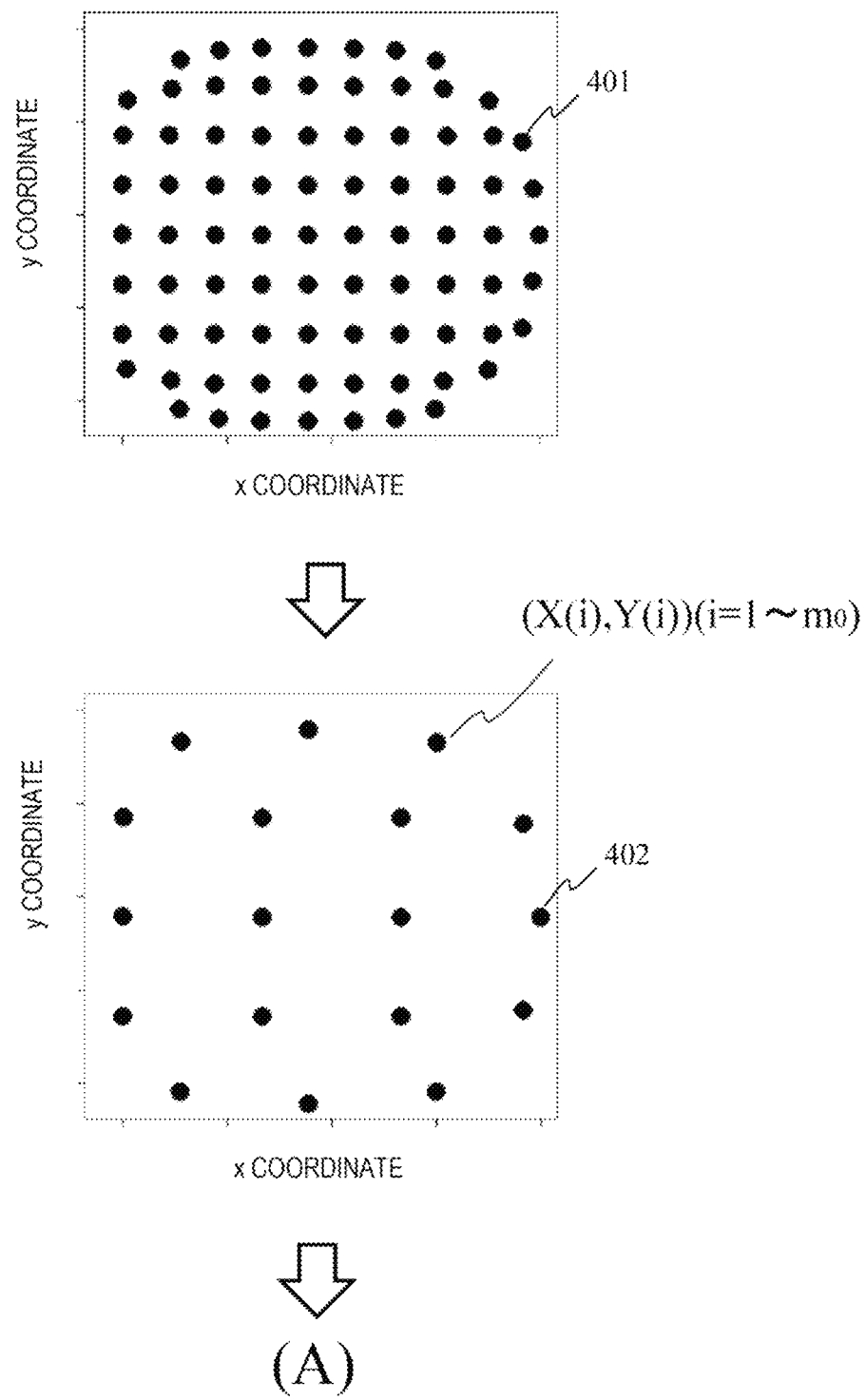

[FIG. 5]
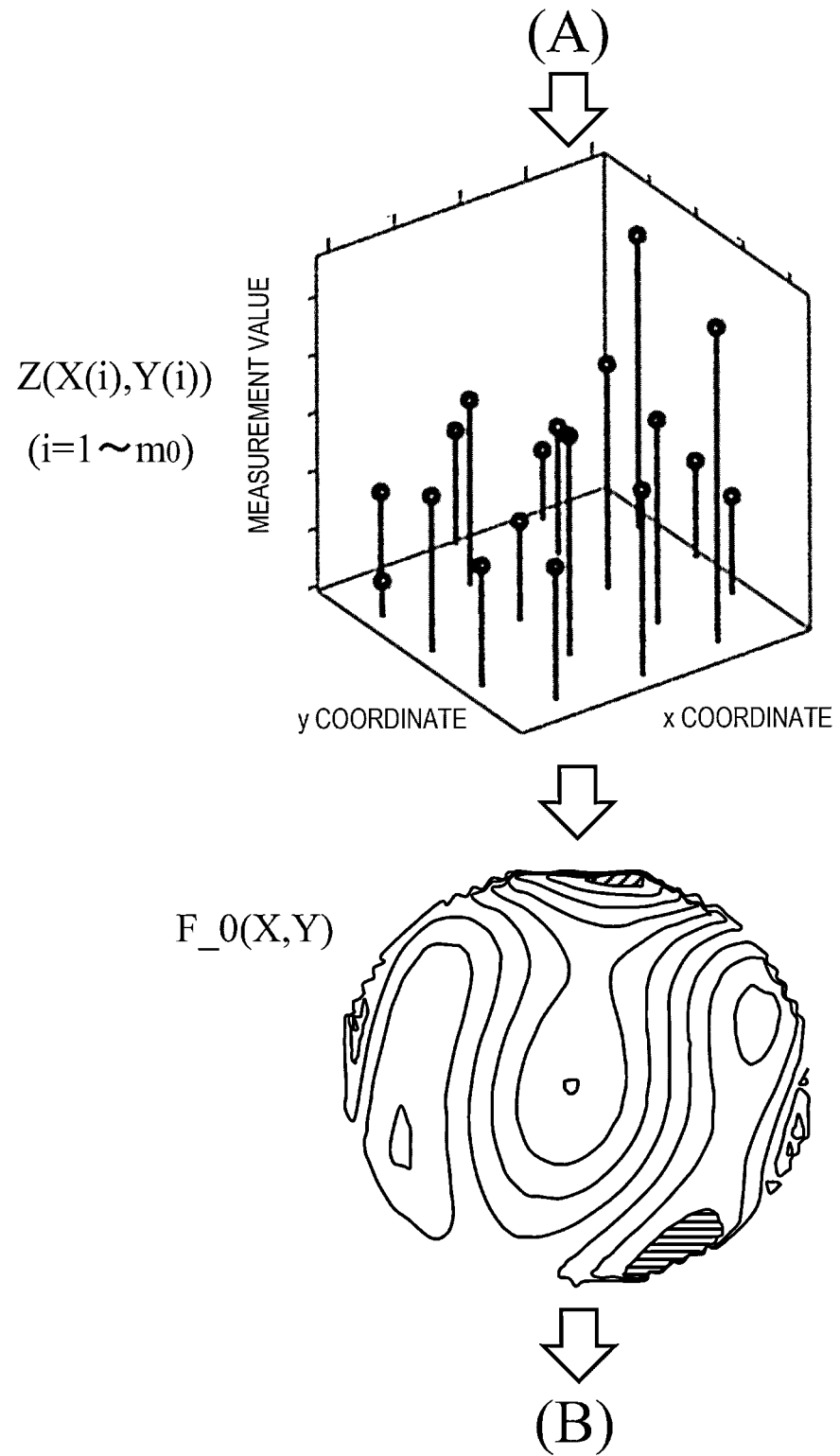

[FIG. 6]
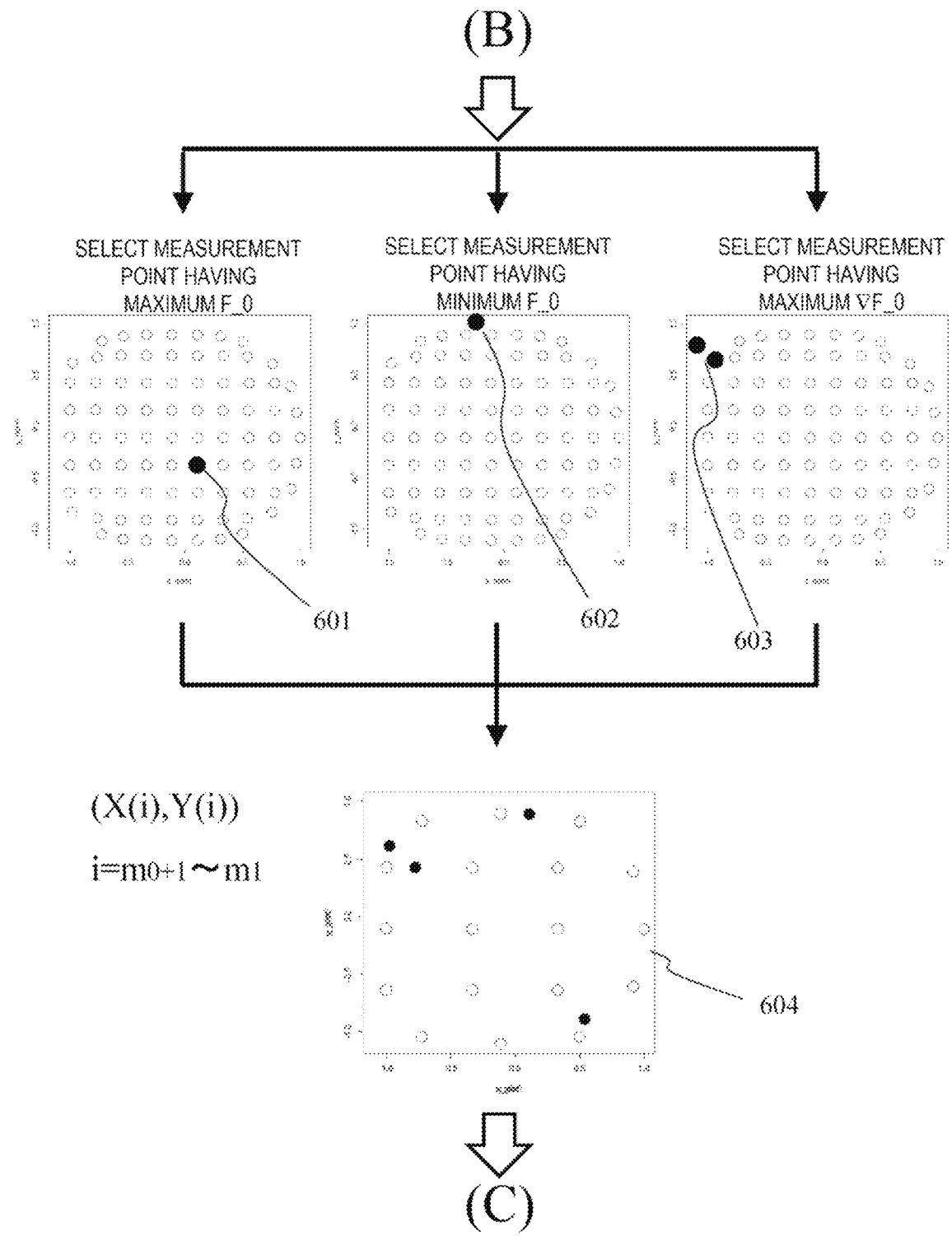

[FIG. 7]
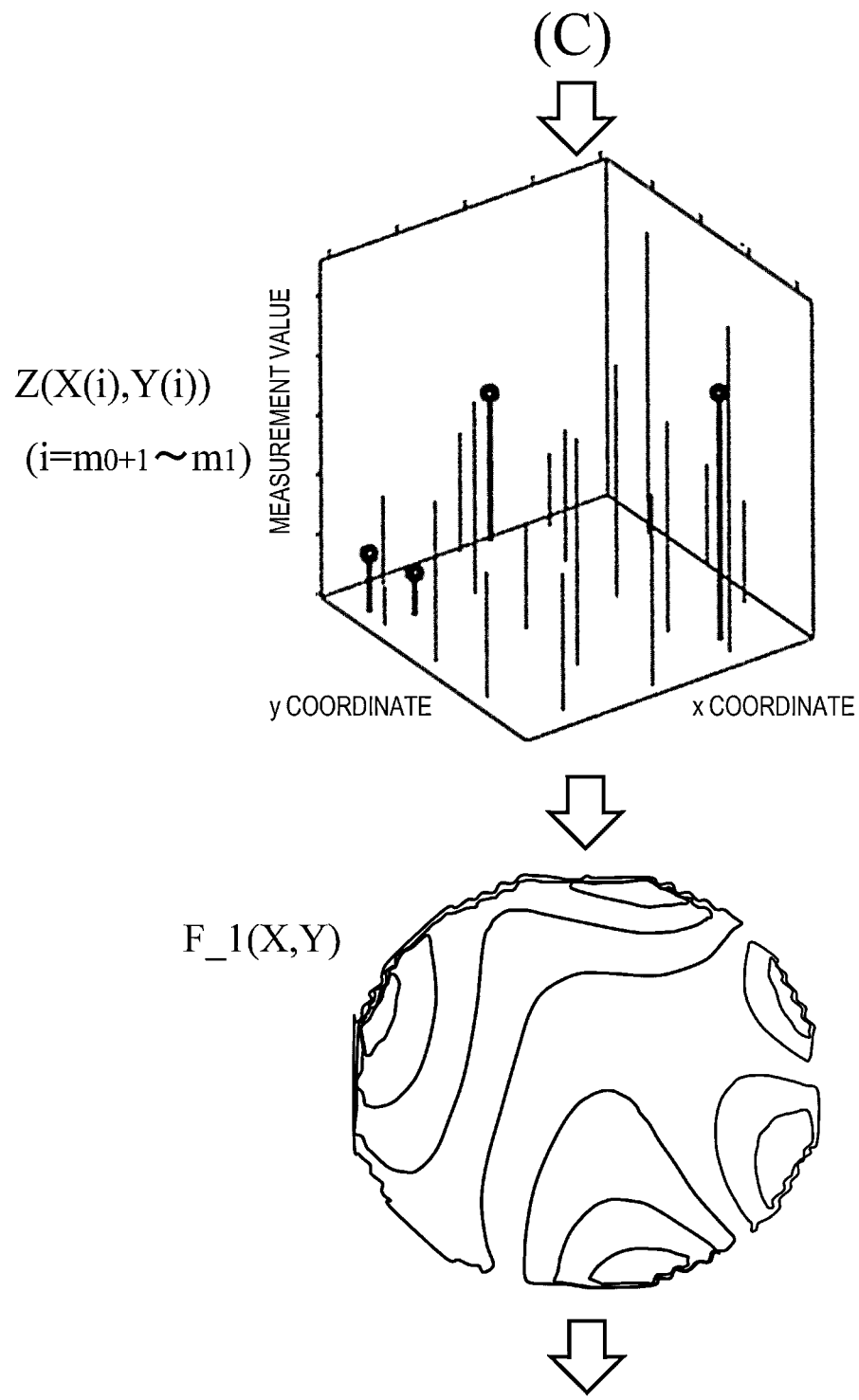

[FIG. 8]
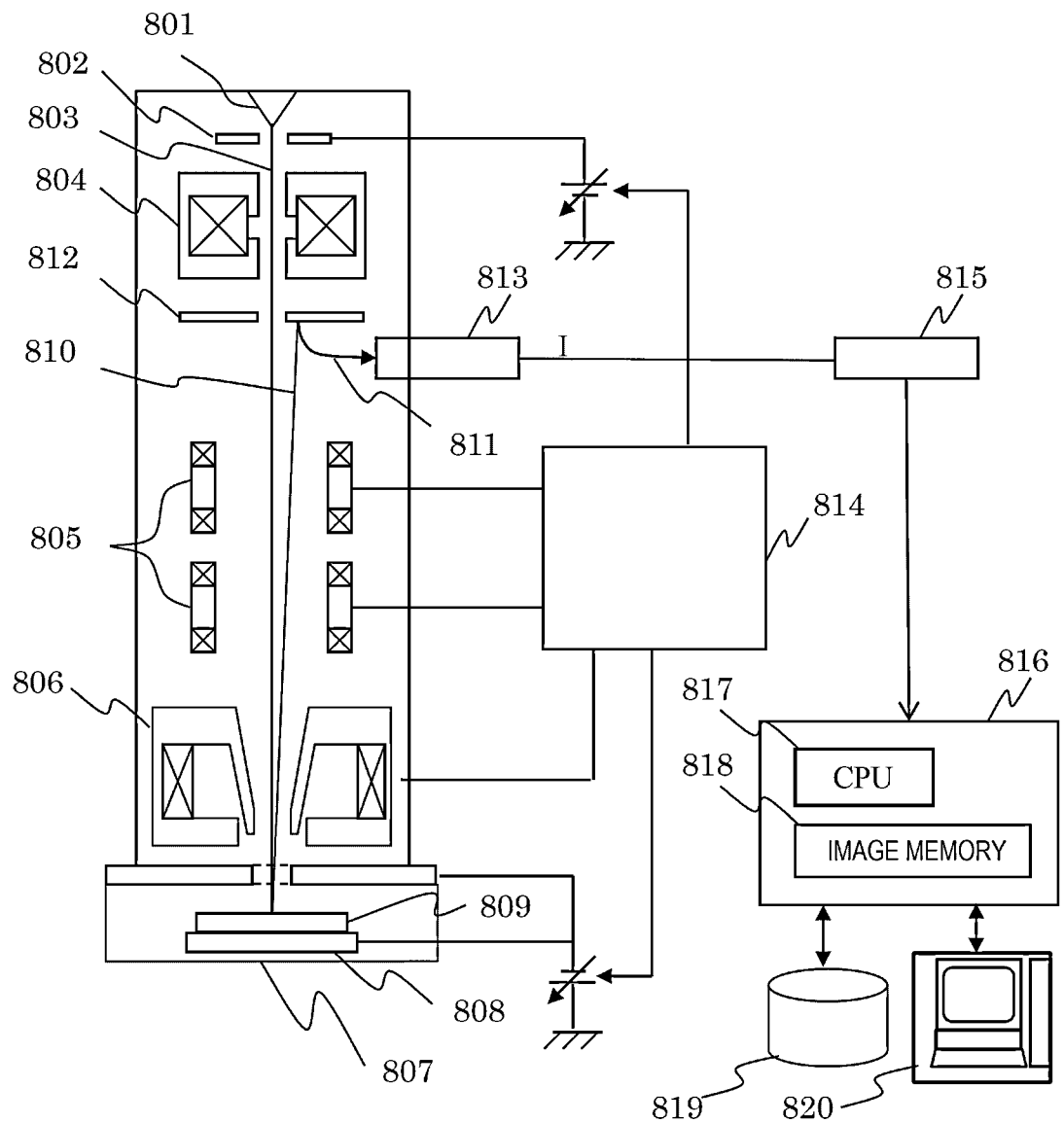

MEASUREMENT METHOD, MEASUREMENT SYSTEM, AND NON-TRANSITORY COMPUTER READABLE MEDIUM

TECHNICAL FIELD

The present disclosure relates to a method and a system for measuring a structure formed on a sample, and a non-transitory computer readable medium, and particularly, relates to a measurement method and a system capable of selectively measuring an appropriate measurement point, and a non-temporary computer readable medium.

BACKGROUND ART

A measurement and inspection apparatus for measuring and inspecting a semiconductor device is used for measuring and inspecting fine patterns, defects, and the like. PTL 1 discloses a measurement apparatus that selects a measurement point from a GUI screen for selecting the measurement point (a sampling point) of a pattern, and performs measurement based on a measurement value obtained at the selected measurement point.

CITATION LIST

Patent Literature

PTL 1: Japanese Patent No. 5809997 (Corresponding U.S. Pat. No. 10,643,326)

SUMMARY OF INVENTION

Technical Problem

In a measurement method disclosed in PTL 1, it is possible to perform appropriate measurement in a case where a pattern or the like to be monitored is determined in advance, but it is difficult to apply the measurement method in a case where the pattern changes due to occurrence of a dimension variation from design data or the like. Hereinafter, in order to implement appropriate feedback to a manufacturing process of a semiconductor device, a method and a system for measuring a structure formed on a sample, which are capable of selecting an appropriate measurement and inspection target, and a non-transitory computer readable medium are proposed.

Solution to Problem

As one aspect for achieving the above object, there is proposed a system including a measurement tool configured to acquire feature data of an object on a wafer; and a computer system configured to communicate with the measurement tool, in which the computer system is configured to perform first processing of receiving feature data of a plurality of locations on the wafer from the measurement tool, second processing of calculating, based on the feature data of the plurality of locations, an in-plane distribution of the feature data on the wafer, third processing of selecting, based on the calculated in-plane distribution, a new measurement point for acquiring the feature data, fourth processing of calculating, based on feature data acquired by the measurement tool performing measurement on the selected new measurement point, a new in-plane distribution of the feature data on the wafer, and fifth processing of outputting at least one of the feature data of the new measurement point and the in-plane distribution which are acquired by executing the third processing and the fourth processing at least once.

Advantageous Effect

According to the above configuration, it is possible to calculate an in-plane distribution of appropriate feature data and select an appropriate new measurement target by performing measurement on a limited number of measurement points.

BRIEF DESCRIPTION OF DRAWINGS

FIG. 1 is a diagram illustrating an example of a measurement system.

FIG. 2 is a flowchart illustrating an example of a measurement process using the measurement system.

FIG. 3 is a flowchart illustrating an example of a measurement process using the measurement system.

FIG. 4 is a diagram illustrating an example of measurement points selected from measurement candidate points on a wafer.

FIG. 5 is a diagram illustrating an example of an in-plane distribution calculated based on measurement results of the measurement points.

FIG. 6 is a diagram illustrating an example in which new measurement points are selected based on the calculated in-plane distribution.

FIG. 7 is a diagram illustrating an example in which a new in-plane distribution is calculated based on measurement results of the new measurement points.

FIG. 8 is a diagram illustrating an outline of a scanning electron microscope which is an example of a measurement tool.

DESCRIPTION OF EMBODIMENTS

Figure 9A:
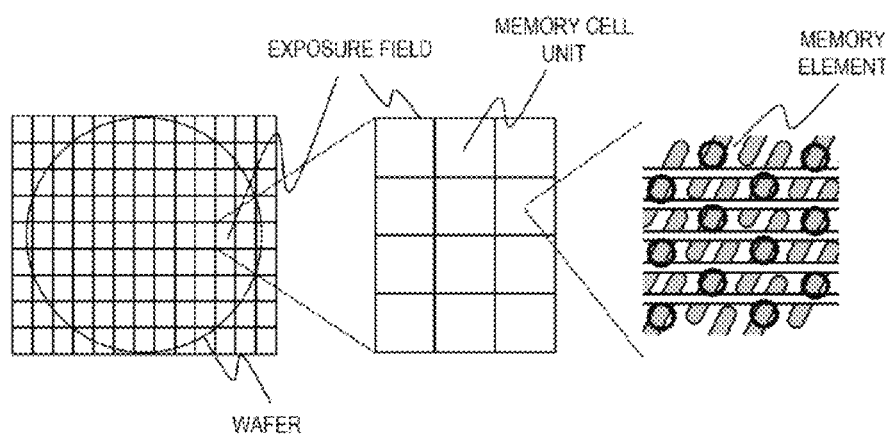
FIGS. 9A to 9C are diagrams illustrating an example of a plurality of measurement targets formed on the wafer.

For example, in manufacture of a semiconductor integrated circuit of a specific type, a plurality of chips existing in a plurality of lots and a plurality of semiconductor wafers are formed by using a plurality of manufacturing apparatuses having the same specification for each of various process steps such as lithography, etching, thin film deposition, and chemical mechanical polishing (CMP). At this time, variations or defects occur in characteristics of manufactured semiconductor chips due to logs of individual wafers, variations and characteristic variations unique to the apparatuses. As a direct cause, for example, dimensions, shapes, positions, material physical properties, and the like of individual devices constituting the circuit deviate from a design, are deformed, or disappear. In order to mass-produce semiconductor integrated circuits having uniform quality with good yield, it is necessary to monitor whether the dimensions, shapes, positions, material physical properties, and the like exceed an allowable range in a wafer plane and in a chip plane.

These abnormalities are classified into, first, a random component due to which the abnormalities occur due to occurrence of a sudden foreign object, noise of the manufacturing apparatus, and the like, and second, a systematic component having a specific in-plane distribution tendency (signature) for each wafer and each mask (exposure field) depending on characteristics of the manufacturing apparatus, the wafer, and a mask pattern. In order to reduce influences of the abnormalities, it is necessary to, firstly, detect the random abnormality and take a measure for a cause of the random abnormality, and secondly, grasp a distribution of the systematic abnormality, specify and correct a cause of the systematic abnormality, or perform a correction to compensate the abnormality in a subsequent process. Specifically, for example, in the case of measurement and correction of misalignment in lithography, it is necessary to know an in-plane spatial distribution of the misalignment, prevent the above distribution by specifying where a cause of the misalignment lies in a process such as the above lithography, etching, thin-film deposition, and CMP, and controlling characteristics of a process apparatus. Further, an influence of the misalignment is minimized by modeling the above spatial distribution and controlling an exposure apparatus to correct a position of an exposure pattern. In this case, components that can be modeled are referred to as the systematic components, and other components are referred to as the random components.

In any of the cases, for each individual wafer, the distribution needs to be known as soon as possible during a manufacturing process. Most accurate grasp of an in-plane distribution means entire plane inspection measurement. However, generally, an enormous amount of time is required for the entire plane inspection measurement, and this is rarely allowed. Therefore, inspections are often performed at predetermined locations sampled in advance. However, since defect occurrence risk level distributions in the wafer plane and the chip plane are different for each wafer and chip due to a process log or a random event, a region with a highest risk level may be overlooked in the above sampling locations. Further, since the random component and the systematic component are mixed at an unknown ratio at each sampling point, it is not always easy to separate the random component and the systematic component from each other.

Therefore, the present disclosure proposes a process of, when measuring desired characteristic data (quality characteristic value) at a plurality of locations in a plane of a wafer or a field to estimate a spatial distribution of the characteristic data in an entire plane of the wafer or the field, estimating an in-plane spatial distribution of the characteristic data based on a measurement result during the measurement, calculating a new measurement point that matches a measurement purpose based on an estimation result, and performing measurement at the new measurement point; a system for implementing the process; and a non-transitory computer readable medium that causes one or more computer systems to perform the process.

Specifically, when inspecting one wafer, wafer characteristics are measured at a plurality of sampling points in a wafer plane in step t (t=1, 2, 3, and so on). For example, an electron beam inspection apparatus or an electron beam measurement apparatus measures a local dimension variation value in a measurement region such as a critical dimension (CD) value, misalignment, line edge roughness (LER), local critical dimension uniformity (LCDU) of a pattern, an edge placement error (EPE) value obtained based on a combination of these, an occurrence probability of a stochastic defect calculated by a predetermined method based on a CD value distribution, and the like.

Next, a wafer in-plane characteristic distribution or a chip in-plane distribution is estimated based on the above measurement results. The in-plane distribution is estimated by fitting the measurement results by a predetermined characteristic distribution model, for example, a Zernike polynomial function in the case of a wafer in-plane distribution, or a Legendre polynomial function in the case of the chip in-plane distribution.

Based on the estimated characteristic distribution obtained as described above, new measurement points which are expected to be optimum for a desired measurement purpose are calculated, and wafer characteristic measurement is performed at the new measurement points.

Further, whether fitting accuracy is improved by adding a measurement result at each of the new measurement points is evaluated. A combination of measurement points providing most excellent fitting results and a fitting distribution at that time are adopted as an estimated characteristic in-plane distribution of the systematic component.

The above steps (estimating the wafer in-plane characteristic distribution based on measurement results with the new measurement points added, and selecting and measuring new measurement points) are repeated until a predetermined condition is satisfied. Finally, the estimated characteristic in-plane distribution is output. Further, a difference between actual measurement values at all measurement points and a value of the estimated characteristic distribution of the measurement points is output as the random component.

According to the above measurement method, measurement locations which are expected to be optimum for the measurement purpose are selected and measured, and results are fed back to select new measurement locations, and thus measurement can be performed while learning a sampling method most suitable for the measurement purpose for each wafer, which enables desired measurement with high accuracy with a minimum number of measurement points for each wafer.

An outline of a measurement system will be described below with reference to drawings. FIG. 1 is a diagram illustrating an example of a basic configuration of the measurement system. The measurement system includes a control and analysis unit and a measurement unit. The measurement system includes at least one computer system, and the computer system includes a module for executing measurement processing in which an output of a measurement apparatus (for example, an electron microscope) described later is used as an input.

FIG. 2 is a flowchart illustrating a measurement process to be performed by the measurement system illustrated in FIG. 1. The computer system provided in the control and analysis unit or the measurement unit executes processing as illustrated in FIG. 2 according to a predetermined operation program. First, the control and analysis unit initially sets measurement locations in a wafer plane or a chip plane and a measurement recipe, and instructs the measurement unit to perform measurement in accordance with the initial setting (step (A)). The measurement unit measures the wafer in accordance with the above instruction, and transmits measurement results to the control and analysis unit (step (B), first processing executed by the computer system). Next, the control and analysis unit estimates an in-plane distribution based on the measurement results, and calculates an estimation index based on the measurement results and estimation values at the measurement points (step (C), second processing executed by the computer system).

Next, based on the estimated in-plane distribution, the control and analysis unit calculates measurement locations which are expected to be suitable for achieving the measurement purpose, updates the measurement recipe as necessary, and instructs the measurement unit to measure the new measurement locations (step (D), third processing executed by the computer system). The measurement unit measures the wafer according to the above instruction, and transmits new measurement results to the control and analysis unit (step (E)).

The control and analysis unit estimates an in-plane distribution for various combinations of measurement results obtained by combining the new measurement and the original measurement, and calculates an index of estimation accuracy by comparing measurement values at all the measured points with the estimation values from the above in-plane distribution. Further, the control and analysis unit calculates a combination of measurement results having highest estimation accuracy, and calculates measurement point coordinates with respect to the combination, an estimated in-plane distribution, a deviation between the estimation value and the measurement value from the above in-plane distribution with respect to all the measured points, and the like (fourth processing executed by the computer system) (step (F)).

Next, the control and analysis unit determines whether to end the measurement based on whether the value of the index (or a change rate thereof) satisfies a predetermined condition, whether a predetermined elapsed measurement time or the number of repetitions of measurement is exceeded, or the like (step (G)). When the measurement is continued, the control and analysis unit returns the processing to step (D), calculates new measurement locations based on a newly estimated in-plane distribution, and repeats the above processes. In the measurement of the one wafer, the measurement is ended when the above process is repeated for a predetermined time or a predetermined number of times, or when the value of the index (or the change rate thereof) satisfies the predetermined condition, and the measurement result and the estimated in-plane distribution are output (step (H), fifth processing executed by the computer system).

Since the measurement locations which are expected to be optimum for the measurement purpose are selected and measured, and results are fed back to select new measurement locations, the measurement system according to the present invention learns the optimum sampling method that matches the measurement purpose for each wafer. Accordingly, the desired measurement can be accurately performed with the minimum number of measurement points for each wafer. A method for selecting the measurement location is set according to the purpose. For example, in the case of a purpose of obtaining a distribution, measurement locations that are expected to be suitable for verifying an estimated distribution are selected. In the case of obtaining a maximum value or a minimum value of the distribution, a location where the distribution is estimated to be the maximum or minimum is selected. The above processes can be performed automatically without human intervention.

An operation of the analysis unit will be described in more detail with reference to FIG. 3. Although it is possible to deal with various measurement targets and measurement contents in the present embodiment, an interlayer alignment measurement using a critical dimension-scanning electron microscope (CD-SEM) will be described as an example. First, as illustrated in FIG. 4, a large number of measurement patterns of the same type existing on the wafer plane are registered in advance as measurement point candidates 401. Since the measurement point candidates 401 are distributed in the chip plane due to characteristics of the mask or the exposure apparatus, it is desirable to select the measurement point candidates 401 at substantially the same positions for each of a plurality of exposure fields on the wafer. An upper part of FIG. 4 is a diagram illustrating a relation between the measurement point candidate 401 on the wafer and coordinates thereof on the wafer. Coordinate information of the measurement point candidate 401 is registered in the measurement recipe, and the CD-SEM performs stage control such that a field of view (FOV) is positioned at the measurement point candidate 401, based on the coordinate information registered in the measurement recipe.

The CD-SEM measures measurement patterns of a plurality of locations (X(i), Y(i)) (i=1 to m0 (the subscript 0 of m is a measurement repetition number)) selected as initial measurement points 402 from the measurement point candidates 401, to obtain measurement values Z (X(i), Y(i)) (step 301 in FIG. 3). The measurement results are transmitted to the computer system for calculation (step 302). As the computer system, a processor built in a scanning electron microscope, which is a measurement tool, or another computer system capable of transmitting and receiving data via a communication medium can be adopted.

For example, in the case of overlay error measurement, imaging with the FOV of about 1 μm square is performed on a measurement pattern designated in advance, and an average positional deviation between an upper layer pattern and a lower layer pattern included in each image is measured. An upper part of FIG. 5 is a diagram illustrating a distribution of the measurement values of the initial measurement points 402. Although the positional deviation is measured separately for each of x and y directions, only one of the positional deviations will be considered here for the sake of simplicity. The initial measurement point is desirably selected with a density as uniform as possible including an outer edge portion of the wafer. The number of measurement points needs to be larger than an order of polynomial fitting described below (the number of unknown coefficients).

Next, regarding in-plane position (X, Y) dependence, for example, the Zernike polynomial fitting is performed on the measurement results Z(X(i), Y(i)) measured at the plurality of points in the wafer plane, and a result (first in-plane distribution) is set as $F\_k(X, Y)$, and k=0 (step 303). Here, k is a measurement repetition number. A lower part of FIG. 5 is a schematic diagram of the wafer in-plane distribution obtained by fitting using the Zernike polynomial function.

Further, the computer system calculates a deviation between the estimation value and actual measurement result based on an arithmetic formula such as Formula 1.

$$\text{error}\_k(X(i),Y(i))=F\_k(X(i),Y(i))-Z(X(i),Y(i)) \qquad [\text{Formula 1}]$$

$F\_k(X(i), Y(i))$ is an estimation value obtained by fitting.

Next, new measurement points in the wafer plane are sampled from the measurement point candidates in accordance with a magnitude of at least one of $F\_k(X, Y)$, a spatial change $\nabla F\_k(X, Y)$, and the error $k(X(i), Y(i))$ (step 304), and the new measurement points are set as (X(i), Y(i)) (i=$m_k$+1 to $m_{k+1}$). The sampling is performed as follows, for example.

First, it is conceivable to select one or more unmeasured candidates having a large estimation value $F\_k(X(i), Y(i))$ among the measurement point candidates (first selection method, a measurement target 601 in FIG. 6). In this case, it is conceivable to select a candidate having a maximum estimation value, and a candidate having an estimation value in top n (n is a natural number equal to or greater than 2), or one or more candidates having an estimation value equal to or greater than a predetermined value from the measurement point candidates. Further, it is conceivable to select one or more unmeasured candidates having a small estimation value from the measurement point candidates (second selection method, a measurement target 602 in FIG. 6). In this case, it is conceivable to select a candidate having a minimum estimation value, and a candidate having an estimation value in last n, or one or more candidates having an estimation value equal to or less than the predetermined value from the measurement candidate points.

It is conceivable to select one or more unmeasured candidates having a large or small value of $|\nabla F\_k(X, Y)|$ (third selection method, measurement targets 603 in FIG. 6). In this case, it is conceivable to select a candidate having a maximum spatial change value, and a candidate having a spatial change value in top n (n is a natural number of 2 or more), or one or more candidates having a spatial change value equal to or greater than a predetermined value from the measurement point candidates. Since $F\_k(X, Y)$ is to be numerically differentiated for being a function.

Further, it is conceivable to select one or more unmeasured points in a region separated from the measurement points selected by the first to third selection methods to some extent (predetermined distance) or in a region where a measurement point density is low (fourth selection method). In this case, for example, it is conceivable to select one or more candidates from unmeasured points separated by 10% of a diameter of the wafer. It is conceivable to select one or more unmeasured candidates in the vicinity of a measurement point having a large value of $error\_k(X(i), Y(i))$ (fifth selection method). In this case as well, it is conceivable to select the candidate having a maximum estimation value, and a candidate having an estimation value in top n, or one or more candidates having an estimation value equal to or greater than a predetermined value from the measurement point candidates.

It is conceivable to set a probability corresponding to at least one of $F\_k(X, Y)$ and $|\nabla F\_k(X, Y)|$, and select unmeasured measurement point candidates based on the probability (sixth selection method). Further, it is also conceivable to randomly select from the unmeasured measurement point candidates (seventh selection method).

Each of the above selection methods is preferably stored in advance in a storage medium built in the computer system or externally. Further, in the case of selecting a plurality of measurement points by applying the selection methods, it is desirable to select the measurement points such that a distance between the measurement points is, for example, about 10% of the diameter of the wafer. Further, it is desirable to select the measurement points (sampling points) by combining two or more of the selection methods. A measurement target 604 illustrated in FIG. 6 illustrates an example of the measurement points selected by the first to fourth candidate selection methods. It is desirable that the total number of measurement points is selected within a predetermined range so as to avoid excessive increase in the number of measurement points. In addition to the above selection methods, the selection of measurement points may be performed by another selection method using an estimation distribution. The seventh selection method is used in combination with other selection methods.

The computer system updates the operation program (measurement recipe) of the CD-SEM in order to measure the selected measurement points (step 305). Specifically, the operation program of the CD-SEM is set such that the FOV of the electron microscope is positioned at the coordinates of the selected measurement points.

Next, the computer system measures the selected measurement points (step 306). An upper part of FIG. 7 is a diagram illustrating a distribution of the measurement results of step 301 and a distribution of new measurement results, and the results are stored in a predetermined storage medium. Then, the new measurement results are added and the Zernike polynomial fitting is performed again to calculate an in-plane distribution (step 307). A result thereof is set as $F\_k+1(X(i), Y(i))$ (a lower part of FIG. 7).

Here, in order to improve the fitting accuracy of the systematic component, it is desirable to select a point where the random component is less from the selected measurement points. Therefore, for example, each measurement point is evaluated as follows. A single point or a combination is selected from the new measurement points, and the measurement results are added to the original measurement results, and fitting is performed to calculate a deviation. A value of the added new measurement point or combination is evaluated according to the degree of change in the fitting result. A fitting result obtained by adding a measurement point having a value equal to or greater than a certain value is used as a new estimation distribution of the systematic component. Alternatively, a fitting result obtained by adding measurement points in a combination having a maximum value is used as the new estimation distribution of the systematic component. As an index of the value evaluation, for example, a value of a fitting deviation with respect to all the measurement points, the number of measurement points having a fitting deviation equal to or less than an allowable value (or a ratio to the total number of measurement points), or change values thereof (with respect to a value before the results of the new measurement points are added), and the like are used.

Due to an influence of a foreign object on a rear surface of the wafer or the like, an abnormality may occur locally in an extremely narrow region inside the wafer. In order to deal with this case, it is conceivable to extract a measurement point where a deviation between the fitting result and the actual measurement result is particularly large. For example, when the index of the value evaluation is improved by a certain value or more in a case where measurement points (Xs, Ys) including the original measurement points are removed from the fitting, the measurement points are excluded from the fitting as singular points, and the in-plane distribution is set as a sum of a polynomial fitting result $F\_n(X, Y)$ excluding the singular point (Xs, Ys) and a distribution $S(X, Y)$ having a peak around the singular point (Xs, Ys). The above procedure is applied to the sum. In a case where the number of measurement points is substantially the same as an unknown number of the model (for example, the order of the Zernike polynomial), the deviation increases as the number of measurement points increases. In this case, the above removal method is effective.

Based on the measurement result and the estimation result obtained by adding the new measurement points, new measurement points are sampled again (step 304). Here, if a maximum value of $F\_k+1(X, Y)$ in the wafer plane is greater than a maximum value of $F\_k(X, Y)$, the new measurement points are sampled again according to $F\_k+1(X, Y)$ and an absolute value of $\nabla F\_k+1(X, Y)$.

Meanwhile, in a case where the maximum value of $F\_k+1(X, Y)$ is smaller than the maximum value of $F\_k(X, Y)$, the new measurement points may be randomly sampled in the wafer plane, or a ratio of the new measurement points may be increased. However, the total number of the new measurement points is within a predetermined range. k+1 is replaced with k, and steps 304 to 307 are repeated n times within an allowable time. A finally obtained $F_n(X, Y)$ is output as a distribution of the measurement results in the wafer plane.

The above measurement processes are continuously performed while the wafer is installed on a stage of the measurement unit (CD-SEM). The time required for the fitting and the measurement point sampling calculation is extremely short with respect to the time required for imaging and measurement.

In addition, in order to prevent so-called overlearning in the polynomial fitting, it is preferable that the number of measurement points used for final polynomial fitting is sufficiently (for example, about twice) larger than the order of the polynomial fitting (the number of unknown coefficients). A so-called bootstrapping sampling method of averaging a plurality of results obtained by fitting a plurality of subsets obtained from a set of final measurement points can be used. Further, a result of low-order fitting and a result of high-order fitting may be combined as appropriate. However, when the result of the high-order fitting is greatly different from the result of the low-order fitting, it is desirable to avoid the use of the high-order fitting.

Although the wafer in-plane distribution has been described above, the invention can also be applied to an exposure field in-plane distribution generated by the characteristics of the mask or the exposure apparatus used for exposing the pattern onto the semiconductor wafer.

For example, with respect to one or more specific exposure fields in the wafer, the same type of pattern measurement is performed at a plurality of positions $(X(j), Y(j))$ ($j=1$ to m) in each exposure field to obtain the measurement values $Z(X(j), Y(j))$. The Legendre polynomial fitting is performed for an exposure field in-plane position $(X, Y)$ dependence of Z, and a result is set as $G_k(X, Y)$, and $k=0$. Here, k is a measurement repetition number.

Hereinafter, in the same manner as described for the wafer plane, $G_n(X, Y)$ finally obtained is output as a distribution of measurement results in the exposure field plane. Further, by combining the wafer in-plane distribution and the exposure field in-plane distribution, the distribution of the measurement targets with respect to an entire region of the wafer can be grasped. Accordingly, for example, a region having a largest misalignment can be specified.

Further, based on the measurement result of the wafer in-plane distribution, an exposure field which is included in a region having a large measurement amount (misalignment or the like) in the wafer plane or includes the region may be selected, and the exposure field in-plane distribution may be measured for the exposure field. Accordingly, for example, a region having a largest misalignment can be specified.

In the above description, after measuring the new measurement points, a polynomial obtained by performing fitting again for all measurement results is used as a new fitting result. In contrast, the polynomial fitting may be performed using Bayesian update as follows. That is, a coefficient of the Zernike polynomial is used as a parameter to consider a probability distribution. An initial distribution is given by averaging values obtained in first measurement, and the distribution is updated by values obtained in the subsequent measurement.

Further, in the above description, the measurement of one wafer has been described, but it may be predicted that there is a correlation of the measurement amount among a plurality of wafers or among different device layers of one wafer. In this case, a measurement result of another wafer or another device layer that has already been measured can be added to this method.

In the first method for that purpose, the selection of the initial measurement points is performed based on a characteristic distribution of another wafer. Until now, when a certain clear characteristic distribution is recognized on a wafer processed by a certain process processing apparatus, for example, a large number of measurement points in a region expected to be close to an allowable limit of a characteristic value are set in advance.

The second method is used in a case where there is a clear characteristic distribution on the wafer, and the measurement values are expected to vary due to various factors. In this case, a predetermined prior probability distribution (probability density function) is set for the measurement value of the characteristic value of each point on the wafer, and the probability distribution is Bayesian-updated by the measurement value of the point on the wafer to be measured. For example, assuming that the prior probability distribution is a normal distribution, the likelihood of the measurement result obtained based on the prior probability distribution is obtained, and a posterior probability distribution is obtained by a product of the prior probability distribution and the likelihood.

An average value of the posterior probability distribution or the value of the characteristic value that gives a maximum value is adopted as the measurement value of the point on the measurement wafer in the present description. In the third method, the predetermined prior probability distribution (probability density function) is set for a parameter of an estimation distribution model according to the present description (for example, the coefficient of the Zernike polynomial), and the prior probability distribution is Bayesian-updated by, for example, the value of the parameter of the estimation distribution model obtained from a wafer to be measured by the method illustrated in FIG. 2. For example, assuming that the prior probability distribution is a normal distribution, the likelihood of the measurement result obtained from the prior probability distribution is obtained, and the posterior probability distribution is obtained by the product of the prior probability distribution and the likelihood. The average value of the posterior probability distribution or the value of the parameter that gives the maximum value is adopted as the parameter of the estimation distribution model in the present description.

Further, the above process, particularly the process of sampling the new additional measurement points in the wafer plane, may be replaced by mechanical learning of a so-called neural network. That is, the above process aims to answer a question of where to measure when adding more measurement points in order to bring the estimated in-plane distribution of the characteristic value closer to a true in-plane distribution when the measurement results of a certain characteristic value is obtained at a plurality of points in the wafer plane or the field plane.

Therefore, a system is considered in which a set including measurement point coordinates and measurement values at the measurement point coordinates is used as an input and coordinates of (a predetermined number of) measurement points to be additionally measured are output, and this system is trained by the following supervised learning.

First, desired characteristic values are measured in advance as much as possible within the wafer plane, and an in-plane distribution thereof is acquired as training data. Further, a distribution estimated by model-fitting using all measurement points is used as a true value approximation distribution.

Next, a network is considered in which coordinates of a plurality of certain initial measurement points selected from the large number of measurement points and measurement values thereof are used as inputs, and coordinates (or coordinate numbers) of a predetermined number of additional measurement points are output.

The coordinates and measurement results of the additional measurement points output from the network are added to the measurement results at the initial measurement points, and the characteristic value distribution is estimated by model-fitting, and a residual (mean square error) from the true value approximation distribution is obtained. The network is trained to reduce the residual (the residual is set as a loss function). The learning is performed using combinations of various initial measurement points of a wafer having various in-plane characteristic value distributions.

When the process of adding new measurement points again based on additional measurement results is repeated, the number of input points changes, and thus in this case, it is preferable to prepare a plurality of networks having different input points and output points, and sequentially use the networks.

FIGS. 4 to 7 show an example in which four new measurement points are selected from 64 points obtained by excluding 18 initial measurement points from 82 measurement point candidates on the wafer. The number of combinations in this case is 635376, and it is necessary to determine an optimum combination among these combinations. In the above example, the optimum combination is determined by performing the processing of steps 304 to 307 for the estimated distribution obtained by fitting the measurement results with a predetermined distribution model. An optimum selection method is learned by updating the distribution model based on the measurement results. By extension, the above process can be expressed as follows.

First, a state of a present time point t of the measurement values obtained at the plurality of measurement point coordinates is set as s. Further, an action of selecting the new measurement points based on a policy n is set as a. A state of measurement values obtained by adding the new measurement points is set as a new state s'. A reciprocal of an average of a difference between a value in the measurement coordinates of the estimated distribution obtained by model-fitting s' and the measurement value is referred to as a reward r of a in s'.

The present embodiment can also be regarded as a problem of reinforcement learning for seeking a measure for maximizing a value function Q(s, a) (represented by a Bellman equation of [Formula 2]) representing a specified value of the reward under the above definition (s, a).

$$Q(s(t),a(t))=E[r(t+1)+\gamma E[Q(s(t+1),a(t+1))]]$$ [Formula 2]

In the case of so-called Q-learning which is a representative method of reinforcement learning, maximizing a reward expectation value and the value function Q is equivalent to obtaining an optimum measure for maximizing the value of the new state, and thus when a function for predicting the optimum measure is considered instead of directly obtaining the function Q, the neural network can be used as the function. In the reinforcement learning, this function (a table in the case of Q-learning) is updated with the process of learning.

When the new measurement points are determined by repeatedly performing the selection method as described above, updating the distribution model-fitting result corresponds to the update of the function. Meanwhile, when the procedure is replaced with the neural network, the neural network can be updated by transfer learning each time a new measurement result is obtained. A learning device is one or more modules or applications built in the computer system, and repeats learning by the update.

In general, when the characteristic values at various points in the wafer plane are measured, the measurement values of the respective points include random components such as a measurement error and noise, or a sudden abnormality. Meanwhile, when the new measurement point selection method as described above or the method using the neural network for selecting new sampling points is applied, it may be difficult to predict a random variation unique to these individual wafers. Therefore, when the model-fitting is performed including the random variation, the fitting accuracy may decrease, and it may be better not to perform fitting using all the measurement points.

Therefore, with respect to the measured results, a combination of measurement points having a minimum residual is selected by using a statistical inference method such as a bootstrap method, and a result obtained by model-fitting these measurement results is referred to as a systematic characteristic value distribution, and a deviation from this distribution is referred to as a random variation. This selection process corresponds to the update of the function corresponding to the individual wafer.

Specifically, in this manner, the systematic part according to the model and the other part can be divided, and the fitting accuracy can be improved by sequentially using a plurality of trained networks on the systematic component.

A so-called autoencoder may be used for separating the systematic characteristic value distribution and the random variation component. When various types of systematic in-plane distributions are input, the autoencoder which inputs and outputs the wafer in-plane characteristic value distribution is trained with various types of systematic in-plane distributions as training data. When a result of an in-plane measurement value of the individual wafer including the measurement error and noise, or the sudden abnormality is input into the autoencoder, the systematic component can be output. Accordingly, it is possible to select measurement points used for model-fitting and further improve the fitting accuracy.

The above calculation or the like is executed by a module or an application installed or stored in the computer system, and is stored in a predetermined storage medium.

Next, an outline of the measurement unit (measurement tool) of FIG. 1 will be described with reference to FIG. 8 FIG. 8 is a diagram illustrating an example of the CD-SEM which is a kind of measurement tool for mainly measuring an edge position of a fine pattern on the wafer and outputting measurement data (metrology data) such as a dimension, a positional deviation, and a variation.

The CD-SEM includes a scanning electron microscope and one or more computer systems for specifying a dimension and an edge position (for example, a difference from a designed edge position) of a pattern based on an output of a detector, and the computer system is configured to read a program stored in a predetermined computer readable medium and execute defect probability estimation processing as described later. The computer system is configured to be communicable with the scanning electron microscope. The computer system may be connected to the scanning electron microscope by one or more transmission media and installed at a position separated from the scanning electron microscope, or may be a module of the scanning electron microscope.

In the scanning electron microscope illustrated in FIG. 8, an electron beam 803 is extracted from an electron source 801 by an extraction electrode 802 and accelerated by an acceleration electrode (not illustrated). The accelerated electron beam 803 is focused by a condenser lens 804 which is an example of a focusing lens, and then is deflected by scanning deflectors 805. Accordingly, the electron beam 803 scans a sample 809 one-dimensionally or two-dimensionally. The electron beam 803 incident on the sample 809 is decelerated by a deceleration electric field formed by applying a negative voltage to an electrode built in a sample table 808, and is focused by a lens action of an objective lens 806 to irradiate a surface of the sample 809. A vacuum is maintained inside a sample chamber 807.

Electrons 810 (secondary electrons, backscattered electrons, or the like) are emitted from an irradiated portion on the sample 809. The emitted electrons 810 are accelerated in a direction of the electron source 801 by an acceleration action based on the negative voltage applied to the electrode built in the sample table 808. The accelerated electrons 810 collide with a conversion electrode 812 to generate secondary electrons 811. The secondary electrons 811 emitted from the conversion electrode 812 are captured by a detector 813, and an output I of the detector 813 changes depending on an amount of the captured secondary electrons. A brightness of a display device changes according to a change in the output I. For example, when a two-dimensional image is formed, a deflection signal to the scanning deflectors 805 and the output I of the detector 813 are synchronized to form an image of a scanning region.

Although an example is shown in which the SEM illustrated in FIG. 8 converts the electrons 810 emitted from the sample 809 once into the secondary electrons 811 at the conversion electrode 812 and detects the secondary electrons 811, of course, the SEM is not limited to such a configuration, and for example, may adopt a configuration in which a detection surface of an electron multiplier tube or the detector is disposed on a trajectory of the accelerated electrons. A control device 814 supplies a necessary control signal to each optical element of the SEM according to an operation program which is called an imaging recipe and controls the SEM.

Next, a signal detected by the detector 813 is converted into a digital signal by an A/D converter 815 and transmitted to an image processing unit 816. The image processing unit 816 generates an integrated image by integrating signals obtained by a plurality of scans in frame units. Here, an image obtained by one scan of the scanning region is referred to as an image of one frame. For example, when images of eight frames are integrated, an integrated image is generated by performing addition averaging processing in pixel units on signals obtained by eight two-dimensional scans. It is also possible to scan the same scanning region a plurality of times to generate and save a plurality of one-frame images for each scan.

Further, the image processing unit 816 includes an image memory 818 which is an image storage medium for temporarily storing a digital image, and a CPU 817 for calculating feature data (a dimension value of a width of a line or a hole, a roughness index value, an index value indicating a pattern shape, an area value of a pattern, a pixel position which is an edge position, and the like) based on the image stored in the image memory 818.

Further, the image processing unit 816 includes a storage medium 819 for storing the measurement value of each pattern, a luminance value of each pixel, or the like. An overall control is configured such that necessary device operations, confirmation of detection results, or the like performed by a workstation 820 can be implemented by a graphical user interface (hereinafter, referred to as GUI).

Further, the image memory is configured to store an output signal (a signal proportional to an amount of the electrons emitted from the sample) of the detector at a corresponding address (x, y) on the memory in synchronization with the scanning signal supplied to the scanning deflectors 805. The image processing unit 816 also functions as an arithmetic processing device that generates a line profile based on the luminance value stored in the memory, specifies the edge position by using a threshold method or the like, and measures a dimension between the edges.

First Embodiment

A semiconductor integrated circuit includes a plurality of device layers, and upper and lower device layers need to be correctly connected or separated. Therefore, when a certain device layer is formed by lithography, it is necessary to correctly position-align the device layer with a lower device layer. In positional alignment (hereinafter, referred to as alignment) in a lithography apparatus, an alignment mark on a wafer and an alignment mark on a mask in a device layer below a resist layer are measured, and a relative position between the wafer and a mask projection image is adjusted based on the measurement result to expose the resist layer.

However, due to a nonlinear deformation of a chip or the wafer, a relative position between an actual circuit pattern on the wafer and the alignment mark deviates from a design value. The relative position between the actual circuit pattern and the alignment mark in the mask projection image also deviates from the design value due to an optical aberration or a scan error of an exposure apparatus. As a result, even when predetermined alignment is performed, positional deviations occur between upper and lower circuit patterns. These positional deviations depend on temporal variations caused by a usage history of the various apparatuses, unique in-plane characteristic distributions, random variations caused by defects on front and back surfaces of the wafer or the like, and thus is spatially non-linear, and an in-plane distribution (signature) thereof changes for each lot, wafer, and chip.

Therefore, whether the positional deviation between the lower circuit pattern and the upper circuit pattern (resist pattern) formed by exposing and developing the resist layer formed on the lower circuit pattern is within an allowable range in the wafer and chip plane is checked for each lot, wafer, and chip, and when the positional deviation is out of the allowable range, the resist is peeled off, and the lithography process is repeated. Further, the in-plane distribution of the positional deviation is correctly measured, and a position and a shape of the mask projection image of the exposure apparatus are controlled in accordance with the in-plane distribution such that the misalignment between the lower circuit pattern and the resist pattern (projection image pattern) is within the allowable range in the wafer and the chip plane in the subsequent exposure. Therefore, it is necessary to correctly grasp the in-plane distribution of the misalignment for each lot, wafer, and chip. In particular, in the above control, the in-plane distribution of the misalignment is fitted by a predetermined function system, and fed back to the exposure apparatus through the fitting.

The number of control parameters of the exposure apparatus is several tens, and several hundreds of measurement points are required to identify the control parameters. In the case of an optical alignment inspection, assuming that several hundreds of points in the plane are to be measured at a speed of 0.1 seconds per point, several tens of seconds is required for one wafer. On the other hand, in recent years, in a manufacturing process of a DRAM, an advanced logic, or the like, a method of directly measuring a misalignment between upper and lower layers based on an SEM observation image of an actual circuit pattern unit is used. Although this method is high in measurement accuracy, one second or more is required for each point, and thus it is necessary to reduce the number of in-plane measurement points to several tens.

The measurement accuracy of each point is improved by the SEM method, but in a case where the number of measurement points is insufficient, when the fitting result cannot correctly reflect an actual misalignment distribution, it is difficult to improve final alignment accuracy. Therefore, it is an important issue to select measurement locations for correctly grasping the in-plane distribution with a limited number of measurements.

Hereinafter, an example in which the present disclosure is applied to alignment measurement at the time of forming a bit line contact of a dynamic random access memory (DRAM) will be described. After forming a transistor of the DRAM, a predetermined insulating layer, a planarizing layer, and a resist layer were formed, the resist layer was exposed and developed using an exposure mask for a bit line contact pattern to form a resist pattern, and the planarizing layer and the insulating layer were etched using the resist pattern as an etching mask to form a bit line contact hole.

Figure 9B:
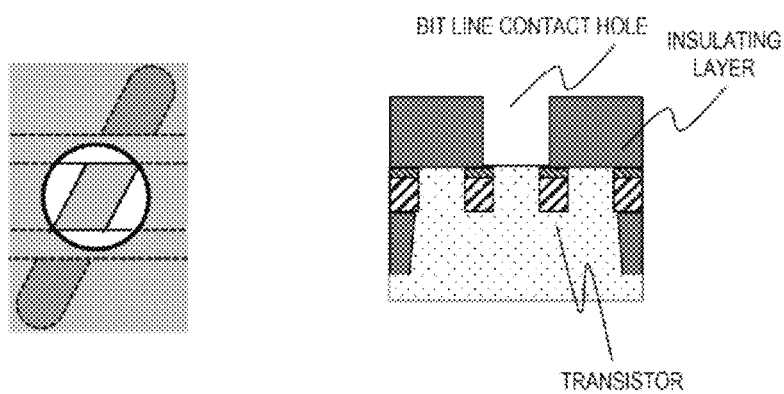
Figure 9C:
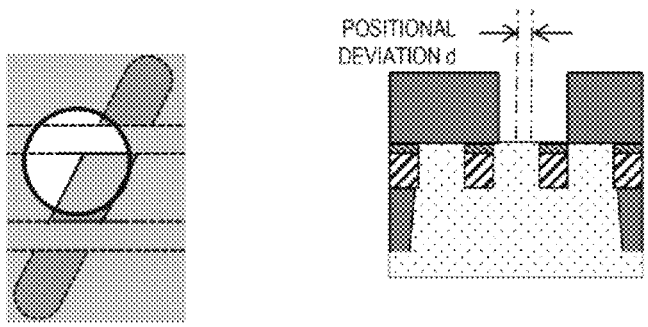
Figure 10A:
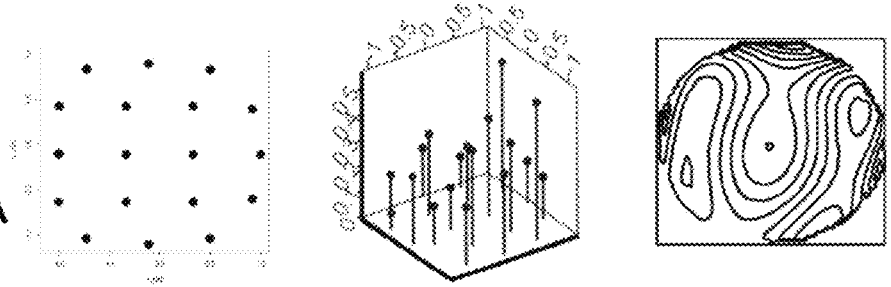
FIGS. 10A to 10D are diagrams illustrating a process of calculating the new in-plane distribution based on measurement of the new measurement points.
Figure 10B:
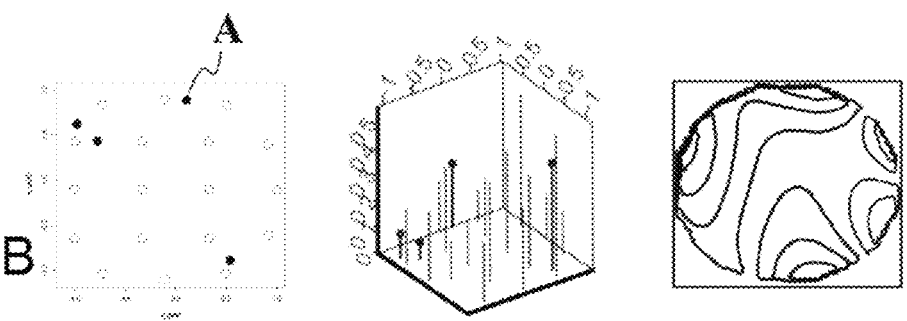
Figure 10C:
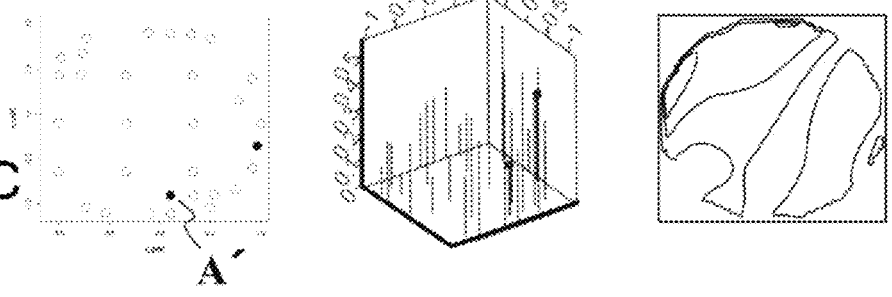
Figure 10D:
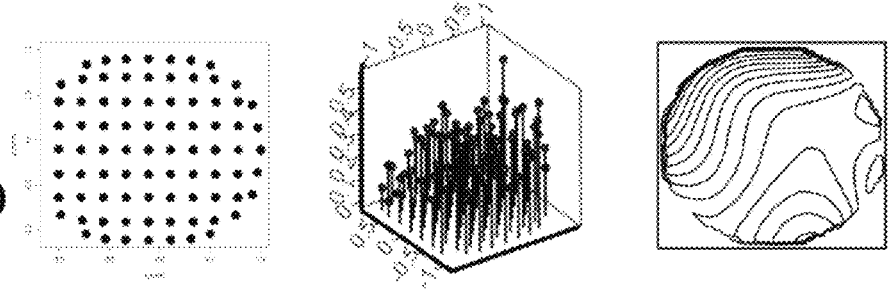

As schematically illustrated in (a) of FIG. 9, a large number of exposure fields are arranged in the wafer, and a large number of memory elements are arranged in memory cell units in the exposure field. The memory cell units were observed with a CD-SEM, and SEM observation images as schematically illustrated on left sides of (b) and (c) of FIG. 9 were obtained. (b) of FIG. 9 illustrates an ideal case where there is no pattern positional deviation between a transistor active layer and the bit line contact, and (c) of FIG. 9 illustrates a case where there is a pattern positional deviation d.

First, as illustrated in a left part in (a) of FIG. 10, 18 exposure fields were selected from the plurality of exposure fields illustrated in the left part of (a) of FIG. 9, SEM images were captured at predetermined positions (indicated by black circles in a right part in (a) of FIG. 9) in these exposure fields, the pattern positional deviation was measured at each position, and results illustrated in a center of (a) of FIG. 10 were obtained. The measurement results were fitted by a Zernike polynomial to obtain an estimated distribution in the wafer illustrated in a right part in (a) of FIG. 10.

Based on the above results, coordinates A included in a plurality of exposure fields illustrated in a left part of (b) of FIG. 10 were selected as new measurement points (indicated by black circles in the diagram), SEM images were captured, the pattern positional deviation was measured at each position, and results illustrated in a center of (b) of FIG. 10 were obtained. The new measurement points were selected mainly in a region where an absolute value of a positional deviation measurement value and a positional change rate thereof were large.

The measurement results based on the new measurement were fitted by the Zernike polynomial to obtain an estimated distribution in the wafer illustrated in a right part in (b) of FIG. 10. Based on the above results, coordinates A' in exposure fields of a plurality of exposure fields illustrated in a left part in (c) of FIG. 10 were selected as new measurement points, SEM images were captured, the pattern positional deviation was measured at each position, and results illustrated in a center of (c) of FIG. 10 were obtained. The measurement results were fitted by the Zernike polynomial to obtain an estimated distribution in the wafer illustrated in a right part in (c) of FIG. 10. As a comparison, results obtained by measuring the pattern positional deviations for predetermined positions (indicated by black circles in a left part in (d) of FIG. 10 in all exposure fields are illustrated in a center of (d) of FIG. 10, and a result obtained by fitting the results is illustrated in a right part in (d) of FIG. 10. According to this method, almost the same results as the results of the total measurement was obtained.

Next, in the same manner, for the exposure fields illustrated in (a) of FIG. 9, SEM images were captured at a plurality of coordinates in the fields, the pattern positional deviation was measured at each position, and the measurement results were fitted with a Legendre polynomial to estimate the distribution in the exposure fields. Based on the estimation result, a plurality of coordinates in the exposure fields were selected as new measurement points, and the pattern positional deviation was measured at each position. The new measurement points were selected mainly in a region where an absolute value of the positional deviation measurement value and a positional change rate thereof were large. The measurement results were fitted again with the Legendre polynomial to estimate the distribution in the exposure fields. This process was repeated to obtain an estimated distribution in the exposure fields.

According to the method described above, a pattern alignment error on the wafer can be accurately measured even with measurement points less by about one order of magnitude than that of the optical alignment method. By performing this inspection at the same level as throughput of the exposure apparatus, RUN to RUN control can be performed even with an exposure apparatus using an electron beam.

Second Embodiment

As described above, the semiconductor integrated circuit is implemented by connecting patterns of circuits and elements existing in the plurality of device layers in a three-dimensional direction. Each circuit pattern is formed by a region surrounded by edges, and whether the circuit operates correctly (yield) is greatly affected by a relative deviation of local edge positions of the upper and lower layer circuit patterns.

The pattern edge positional deviation is referred to as edge placement error (EPE), and is approximately represented by at least one of Formula 3 or Formula 4 based on misalignment $\Delta OVL$ (Overlay Error) between the upper and lower layer patterns (average misalignment described in the first embodiment), a deviation $\Delta CD$ from a design value of an average dimension of the pattern of each layer, and a local variation (edge roughness (Line Edge Roughness: LER) or uniformity of a local CD (Local CD Uniformity: LCDU)) of a pattern edge position of each layer.

$$EPE^2 = \Delta OVL^2 + \Delta CD^2 + LER^2 \quad \text{[Formula 3]}$$

$$EPE^2 = \Delta OVL^2 + \Delta CD^2 + LCDU^2 \quad \text{[Formula 4]}$$

Therefore, in addition to preventing the misalignment $\Delta OVL$ described in the first embodiment, preventing the $\Delta CD$ and the LER or the LCDU leads to an improvement in the yield. In particular, in recent years, an influence of the latter is becoming larger than an influence of the misalignment. On the other hand, causes of a wafer in-plane variation and an exposure field in-plane variation are different from a cause of the misalignment, and depends on states of the various apparatuses or the wafer and the mask. Although a dangerous region where the EPE may exceed an allowable range is determined by a combination of three elements, it cannot be generally expected that a predetermined measurement location overlaps with a region of a worst combination. Therefore, it is desirable to select a measurement location independently of the first embodiment.

In the present embodiment, an example of performing EPE measurement when forming a local wiring of a logic integrated circuit by a combination of a periodic one-dimensional pattern and an isolated block pattern (multi-patterning) will be described.

First, the periodic one-dimensional pattern is formed by liquid-immersion ArF exposure (an exposure method using an argon fluoride excimer laser as a light source of light while employing a technique of increasing resolution by inserting a liquid having a high refractive index between a projection lens of an exposure apparatus and the wafer (resist) to make the wavelength of light shorter than that in the atmosphere) and a self-aligned quad rule patterning (SAQP) method, and in the same manner as in the first embodiment, an average trench width, a deviation $\Delta CD1$ from a design, and an in-wafer distribution and an in-exposure field distribution of line edge roughness LER1 are measured and estimated. After predetermined flattening, resist coating and EUV exposure are performed to form a block pattern so as to overlap the trench. With respect to the formed block pattern, in the same manner as in the first embodiment, a relative positional deviation $\Delta OVL\_12$ with respect to the trench (the relative positional deviation is set as a reference 0 in a case as designed), a deviation $\Delta CD2$ of an average value of each of vertical dimensions from the design, an in-wafer distribution and an in-exposure field distribution of a variation LCDU2 of the vertical dimensions are measured and estimated. Thereafter, EPE was calculated using [Formula 5].

$$EPE = \Delta OVL\_12^2 + \Delta CD1^2 + \Delta CD2^2 + LER1^2 + LCDU2^2 \quad \text{[Formula 5]}$$

Accordingly, an in-plane distribution of the EPE can be grasped with a minimum number of measurement points. Although the example in which the SEM is used has been described above, the measurement of each item is not limited thereto, and an apparatus based on various principles may be used. For example, alignment measurement may performed using an optical alignment measurement apparatus, dimension measurement may be performed by scatterometry, and the LER may be measured using a flare noise (haze) level of an optical defect inspection apparatus. By obtaining the distribution of the EPE using a computer system based on outputs of these various apparatuses, it is possible to determine whether the wafer can be continuously processed, clarify a cause of a defect, and feed the cause back to a manufacturing apparatus.

Third Embodiment

In recent years, an exposure method using EUV light having a wavelength of 13.5 nm has begun to be applied to production. In the EUV exposure method, there is a concern about occurrence of a stochastic defect in future miniaturization. The stochastic defect is a fatal defect such as a bridge between lines, a disconnection of a line, and disappearance of an isolated pattern, which occurs in an ultrafine pattern with an extremely low probability of, for example, $10^{-12}$ to $10^{-4}$.

The occurrence probability is extremely sensitive to a slight variation in a finished dimension of a resist and slight variations in focus, mask conditions, and the like, and increases by 1 to 2 orders of magnitude when, for example, deviates from a design dimension by 1 nm. Therefore, it is necessary to monitor the stochastic defect in a semiconductor mass production process using EUV exposure.

The dimension of the stochastic defect is often smaller than a minimum pattern dimension, is difficult to detect without SEM, and is difficult to predict in advance where the stochastic defect will occur on the wafer. However, assuming that an entire wafer plane is inspected using the SEM, for example, even an SEM having a wide FOV of 80 μm square needs to capture images 107 times and 1000 days or more is required when 15 seconds is required for imaging of one FOV.

Even if the imaging speed is increased 100 times with a multi-beam apparatus, ten days is required. In addition, in order to grasp a defect occurrence probability distribution in the wafer plane, seven days is required even if the 80 μm square is sampled and measured every 1 mm in vertical and horizontal directions.

Therefore, in the present embodiment, a region with a risk of defect is intensively inspected and measured while estimating the region in parallel with the measurement. As a method of measuring or estimating the defect occurrence probability of a local region, the following two methods are considered. In the present embodiment, a measurement sampling method for measuring the defect occurrence probability in a certain local region mainly in the wafer plane and the exposure field plane will be described.

In a first method, all target patterns in the local region are measured to measure the local defect occurrence probability. By measuring as many patterns as possible in a limited region, for example, about ten million patterns, the local defect occurrence probability can be detected when the defect occurrence probability in the region is about $10^{-7}$ or more. For example, in the case of a hole defect inspection with a pitch of 40 nm, about ten million holes are included in an 80 μm square. When the measurement is performed by using an electron beam measurement apparatus having an FOV of 80 μm square without moving a stage, the measurement can be performed within one minute (for example, fifteen seconds).

In a second method, the defect occurrence probability can be estimated based on a tail of a frequency distribution of local pattern dimensions obtained by measuring a certain limited region. According to this method, it is possible to predict a defect occurrence probability that is several orders of magnitude lower than a reciprocal of the number of measurement patterns. That is, it is possible to estimate (measure) a defect occurrence probability of, for example, 1/10 billion or less from the measurement of ten million holes. Alternatively, for example, a defect occurrence probability of 1/100 million or less can be estimated (measured) by measuring patterns of a number (for example, about 100,000) smaller than the above.

Hereinafter, an example of estimating an in-wafer plane distribution and an in-chip plane distribution of the occurrence probability of the stochhotic defects will be described. In the present embodiment, it is not necessary to obtain an accurate distribution for a region where the defect probability is low. Therefore, the distributions are selectively fitted for a region having a high risk and a high defect probability. A main purpose is to estimate a region where the defect probability is large in the wafer and a maximum value thereof, rather than estimating the accurate distribution as in the two embodiments described so far.

The region in which the defect probability is large is selected from, for example, measurement value coordinates selected by the selection method described above, and fitting is performed on a predetermined narrow region, which is one or more regions including one or more measurement points selected by the selection method, such that the region can be narrowed and one or more regions can be selected (for example, so as to make the predetermined narrow region narrower than a previous fitting region).

First, a local region of 80 μm square is imaged at a plurality of initial positions designated in advance in the wafer. In the present embodiment, a two-dimensional array pattern in which hole patterns of 20 nm are arranged at a pitch of 40 nm in an x direction and a y direction in each local region will be described as an example. Data of each captured image includes about 2,000,000 hole patterns. For each hole pattern included in the data of each image, dimensions are measured and defects are determined. When one or more defects are included in the about 2,000,000 holes, a defect probability of the local region is calculated based on the defects.

When no defect is detected, the defect probability of the local region can be calculated based on a histogram of the hole dimensions.

In the present embodiment, as in the first embodiment and the like, measurement results are fitted at wafer in-plane coordinates to estimate the wafer in-plane distribution of the defect occurrence probability (step B in FIG. 2). A plurality of measurement locations are newly sampled from the region where the defect occurrence probability and a change rate thereof are estimated to be large (step C in FIG. 2). The measurement locations are to be selected so as to be sufficiently separated from each other from one with a larger estimation value.

A region of 80 μm square is imaged at each of the new measurement locations, and the defect occurrence probability is measured (step D in FIG. 2). A deviation between the defect probability estimated from the fitting at the new measurement locations and an actual measurement result is calculated (step E in FIG. 2), and an absolute value of the deviation is determined (step F in FIG. 2). When any one of the deviations is larger than a predetermined value, the deviation from a design height/shape is refitted at wafer in-plane coordinates for all measurement results including new measurement results, and the wafer in-plane distribution is estimated (step B in FIG. 2). After the estimation, the measurement location sampling (step C in FIG. 2), the defect occurrence probability measurement (step D in FIG. 2), the calculation of deviation between the measurement result and the estimation value (step E in FIG. 2) are repeated until the deviation is equal to or smaller than a predetermined threshold value or the predetermined allowable time elapses.

Accordingly, it is possible to estimate the region where the defect occurrence probability was measured to be the largest and an approximate distribution in the wafer with the minimum number of measurement points. The time required for the fitting and the measurement point sampling calculation is extremely short with respect to the time required for imaging and measurement. Further, by performing the same process on the in-plane distribution of the exposure field, the in-plane defect occurrence probability of the field can also be estimated.

Fourth Embodiment

In the above three embodiments, the inspection and the measurement of the abnormality in a planar direction of the pattern have been described, but the method disclosed in this specification can also be applied to inspection and measurement of the abnormality in a three-dimensional direction of the pattern. In the present embodiment, a height and a wafer in-plane distribution of a cross-sectional structure of a resist pattern formed by EUV exposure and development on the wafer were measured by atomic force microscope (AFM) as follows.

First, a height and a cross-sectional shape of the resist pattern are measured by AFM at a plurality of initial positions designated in advance (steps A and B in FIG. 2). Deviations from a design height and a design shape were calculated for the measurement result, and the deviations were fitted at wafer in-plane coordinates to estimate a wafer in-plane distribution of the deviations (step C in FIG. 2). New measurement points were calculated for a portion where the deviation and a change rate thereof were estimated to be large (step D in FIG. 2), and a height and a cross-sectional shape of the resist pattern were measured by AFM at the new measurement points (step E in FIG. 2).

The measurement, the characteristic value spatial distribution estimation, and the selection of the new measurement point based on the characteristic value spatial distribution were repeated until the deviation between the measurement result and the estimation value is equal to or smaller than a predetermined threshold value or a predetermined allowable time elapses, and then the estimation distribution and the measurement result were output. Accordingly, it is possible to estimate the region having a largest deviation from the design value and an approximate distribution in the wafer with the minimum number of measurement points. According to the present embodiment, the wafer in-plane distribution of a cross-sectional structure of the resist pattern can be estimated with high accuracy in a shorter time than in the related art. Since the shape measurement performed by the AFM generally requires time, it is possible to expect an effect of significantly reducing the measurement time based on the reduction of the number of measurement points by applying the present embodiment.

In the present embodiment, an example in which the AFM is used as a measurement tool in order to set a step (height) of a pattern or the like as feature data has been described, but the method for specifying a region or the like having a largest deviation or the spatial distribution estimation method described in the present specification can also be applied to measurement using another scanning probe microscope (SPM) for measuring other characteristic values.

Fifth Embodiment

In the above four embodiments, the inspection and the measurement of the abnormality in a physical shape of the pattern have been described, but the present disclosure can also be applied to inspection and measurement of an abnormality in material physical properties. In the present embodiment, an example will be described in which spatial distribution estimation and selection of new measurement points are repeated using, as a measurement value, an analysis result obtained by elemental composition analysis (hereinafter, referred to as EDX) based on X-ray micro analysis of a semiconductor integrated circuit thin film formed on a wafer. Examples of the characteristic value include a signal intensity (X-ray intensity of a specific energy) of one or more elements. In order to perform the EDX, a semiconductor detector for detecting X-rays is installed in a vacuum sample chamber of a scanning electron microscope as illustrated in FIG. 8, and the count number of X-rays corresponding to the energy of X-rays is measured by a computer system based on an output of the detector.

A measurement example using a measurement system including a scanning electron microscope equipped with such an EDX detector and a computer system will be described. First, EDX analysis is performed at a plurality of initial positions designated in advance on a semiconductor wafer to measure an elemental composition (characteristic value, feature data extraction) (step B in FIG. 2). A wafer in-plane distribution of a specific element concentration was estimated by performing fitting at wafer in-plane coordinates (step C in FIG. 2). New measurement points were calculated for a point having a maximum estimated distribution, a point having a minimum estimated distribution, a portion where a change rate was estimated to be large, and the vicinity thereof (step D in FIG. 2), and the EDX analysis was performed again at the new measurement points to measure the elemental composition (step E in FIG. 2). This process was repeated until the deviation between the measurement result and the estimation value is equal to or less than a predetermined threshold value or a predetermined allowable time elapses, and then the estimated distribution and the measurement result were output. According to the present embodiment, the wafer in-plane distribution of the elemental composition of the semiconductor integrated circuit thin film can be estimated with high accuracy in a shorter time than in the related art. Since the elemental composition analysis based on the EDX generally requires time, it is possible to expect an effect of significantly reducing the measurement time based on the reduction of the number of measurement points by applying the present embodiment.

REFERENCE SIGN LIST

- 801 electron source
- 802 extraction electrode
- 803 electron beam
- 804 condenser lens
- 805 scanning deflector
- 806 objective lens
- 807 sample chamber
- 808 sample table
- 809 sample (wafer)
- 810 electron
- 811 secondary electron
- 812 conversion electrode
- 813 detector
- 814 control device
- 815 A/D converter
- 816 image processing unit
- 817 CPU
- 818 image memory
- 819 storage medium
- 820 workstation

The invention claimed is:

1. A system comprising:
a measurement tool configured to acquire feature data of an object on a wafer; and
a computer system configured to communicate with the measurement tool, wherein
the computer system is configured to perform
first processing of receiving feature data of a plurality of locations on the wafer from the measurement tool,
second processing of calculating, based on the feature data of the plurality of locations, an in-plane distribution of the feature data on the wafer,
third processing of selecting, based on the calculated in-plane distribution, a new measurement point for acquiring the feature data,
fourth processing of calculating, based on feature data acquired by the measurement tool performing measurement on the selected new measurement point, a new in-plane distribution of the feature data on the wafer, and
fifth processing of outputting at least one of the feature data of the new measurement point and the in-plane distribution which are acquired by executing the third processing and the fourth processing at least once.

2. The system according to claim 1, wherein
the new measurement point is selected in the third processing such that, in the in-plane distribution obtained by the fourth processing, the feature data of the plurality of locations and the new measurement point is estimated with a smaller error than that in the in-plane distribution obtained by the second processing.

3. The system according to claim 1, wherein
the computer system is configured to select, in the third processing, an unmeasured point at which an estimation value of the feature data obtained from the in-plane distribution is maximum, at which the estimation value is in top n (n is a natural number equal to or greater than 2) or at which the estimation value is equal to or greater than a predetermined value, or one or more unmeasured points separated by a predetermined distance from the unmeasured point.

4. The system according to claim 1, wherein
the computer system is configured to select, in the third processing, an unmeasured point at which an estimation value of the feature data obtained from the in-plane distribution is minimum, at which the estimation value is in last n (n is a natural number equal to or greater than 2) or at which the estimation value is equal to or less than a predetermined value.

5. The system according to claim 4, wherein
the computer system is configured to select one or more unmeasured points separated by a predetermined distance from the unmeasured point selected in the third processing.

6. The system according to claim 1, wherein
the computer system is configured to select, in the third processing, an unmeasured point at which a spatial change value of the feature data obtained from the in-plane distribution is maximum.

7. The system according to claim 6, wherein
the computer system is configured to select one or more unmeasured points separated by a predetermined distance from the unmeasured point selected in the third processing.

8. The system according to claim 1, wherein
the computer system is configured to select, in the third processing, an unmeasured point at which a spatial change value of the feature data obtained from the in-plane distribution is minimum.

9. The system according to claim 1, wherein
the computer system is configured to select, in the third processing, a measurement point at which a deviation between an estimation value of the feature data obtained from the in-plane distribution and a measurement value obtained by the measurement tool satisfies a predetermined condition.

10. The system according to claim 1, wherein
the computer system is configured to select, in the third processing, an unmeasured point according to the feature data obtained from the set in-plane distribution or a probability of a spatial change value of the feature data obtained from the in-plane distribution.

11. The system according to claim 1, wherein
the computer system is configured to calculate the in-plane distribution of the wafer by at least one of the second processing and the fourth processing.

12. The system according to claim 11, wherein
the computer system is configured to calculate the in-plane distribution of the wafer by performing fitting using a Zernike polynomial.

13. The system according to claim 1, wherein
the computer system is configured to calculate an in-plane distribution of at least one exposure field included in the wafer by at least one of the second processing and the fourth processing.

14. The system according to claim 13, wherein
the computer system is configured to calculate the in-plane distribution of the exposure field by performing fitting using a Legendre polynomial.

15. The system according to claim 1, wherein
the computer system is configured to repeat learning of a learning device based on reinforcement learning by selecting the new measurement point.

16. The system according to claim 1, wherein
the measurement tool is a charged particle beam device.

17. The system according to claim 16, wherein
the charged particle beam device includes an X-ray detector configured to detect an X-ray generated by irradiation of a charged particle beam to the wafer, and the feature data is an analysis result obtained based on an output of the X-ray detector.

18. The system according to claim 1, wherein
the measurement tool is a scanning probe microscope.

* * * * *